United States Patent
Parupalli

(10) Patent No.: US 12,431,850 B2
(45) Date of Patent: Sep. 30, 2025

(54) DIFFERENTIAL DRIVER HAVING INPUT SIGNAL-CONTROLLED COMMON-MODE REFERENCE

(71) Applicant: CIRRUS LOGIC INTERNATIONAL SEMICONDUCTOR LTD., Edinburgh (GB)

(72) Inventor: Vamsikrishna Parupalli, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 589 days.

(21) Appl. No.: 17/894,294

(22) Filed: Aug. 24, 2022

(65) Prior Publication Data

US 2024/0072747 A1    Feb. 29, 2024

(51) Int. Cl.
    *H03F 3/45*      (2006.01)
(52) U.S. Cl.
    CPC ....... *H03F 3/4565* (2013.01); *H03F 3/45183* (2013.01); *H03F 3/45475* (2013.01)
(58) Field of Classification Search
    CPC ............... H03F 3/4565; H03F 3/45183; H03F 3/45475; H03F 3/2173; H03F 3/45959; H03F 3/45; H03F 2200/351; H03F 2203/45138; H02P 6/30; H02P 7/04; H02P 27/08
    USPC .................. 330/10, 207, 253, 258, 260, 310
    See application file for complete search history.

(56) References Cited

U.S. PATENT DOCUMENTS

| | | |
|---|---|---|
| 5,550,450 A | 8/1996 | Palko et al. |
| 6,995,537 B1 | 2/2006 | Plutowski et al. |
| 7,053,806 B1 | 5/2006 | Rao et al. |
| 7,227,390 B1 | 6/2007 | Bapat et al. |
| 7,463,089 B1 | 12/2008 | Bapat et al. |
| 7,579,910 B2 | 8/2009 | Zhang et al. |
| 8,115,366 B2 | 2/2012 | Hoffman et al. |

(Continued)

OTHER PUBLICATIONS

Ramirez-Angulo, et al.,"A High-Swing, High-Speed CMOS WTA Using Differential Flipped Voltage Followers", IEEE Transactions On Circuits and Systems, vol. 54, No. 8, Aug. 2007, Piscataway, NJ, pp. 668-672 (pp. 1-5 in pdf).

(Continued)

*Primary Examiner* — Andrea Lindgren Baltzell
*Assistant Examiner* — Nareh Shamiryan
(74) *Attorney, Agent, or Firm* — Mitch Harris, Atty at Law, LLC; Andrew M. Harris

(57) ABSTRACT

A differential amplifier provides improved signal swing and reduced common-mode output noise. The differential amplifier circuit includes a driver circuit with a first output for driving a first output of the differential amplifier and with a second output for driving a second output of the differential amplifier. The driver circuit has inputs for receiving a differential (complementary) pair of input signals at least one common-mode reference input for receiving a common-mode reference signal. The differential amplifier also includes a signal maxima detector having inputs for receiving the differential input signals that detects a maximum value between the individual signals, including any input common-mode voltage. The differential amplifier also includes a common-mode reference circuit that provides the common-mode reference signal and an input coupled to an output of the signal maxima detector, so that a common-mode voltage of the outputs is independent of power supply voltages provided to the driver circuit.

22 Claims, 7 Drawing Sheets

(56) References Cited

U.S. PATENT DOCUMENTS

| | | |
|---|---|---|
| 8,139,792 B2 | 3/2012 | Magrath |
| 8,803,569 B1 | 8/2014 | Malladi et al. |
| 9,219,414 B2 | 12/2015 | Shao |
| 9,319,033 B1 | 4/2016 | Jin et al. |
| 9,735,574 B2 | 8/2017 | Tournatory et al. |
| 9,929,664 B2 | 3/2018 | King et al. |
| 9,960,741 B2 | 5/2018 | Mengad et al. |
| 9,973,156 B2 | 5/2018 | King et al. |
| 10,034,085 B2 | 7/2018 | Cho et al. |
| 10,298,188 B2 | 5/2019 | Kiyono |
| 10,439,539 B2 | 10/2019 | Lopez et al. |
| 10,547,267 B2 | 1/2020 | Li et al. |
| 10,734,981 B1 | 8/2020 | Zanbaghi et al. |
| 10,996,634 B2 | 5/2021 | Yao et al. |
| 11,037,596 B2 | 6/2021 | Miura |
| 11,070,177 B2 | 7/2021 | Singh et al. |
| 11,115,046 B2 | 9/2021 | Parupalli et al. |
| 11,190,136 B2 | 11/2021 | Yuan et al. |
| 11,290,070 B2 | 3/2022 | Zanbaghi et al. |
| 11,309,853 B1 | 4/2022 | Peterson et al. |
| 11,329,617 B1 | 5/2022 | Peterson et al. |
| 2003/0006749 A1 | 1/2003 | Rollman |
| 2007/0229159 A1 | 10/2007 | Krishnan et al. |
| 2008/0246455 A1 | 10/2008 | Chu et al. |
| 2009/0201083 A1 | 8/2009 | Guanziroli et al. |
| 2012/0013321 A1 | 1/2012 | Huang et al. |
| 2013/0136278 A1 | 5/2013 | Quilter |
| 2013/0173980 A1 | 7/2013 | Xi |
| 2016/0182998 A1 | 6/2016 | Galal et al. |
| 2018/0115250 A1 | 4/2018 | Ng et al. |
| 2018/0331624 A1 | 11/2018 | Pullen et al. |
| 2022/0158597 A1 | 5/2022 | Zanbaghi et al. |
| 2022/0247367 A1 | 8/2022 | Melanson et al. |
| 2022/0337181 A1 | 10/2022 | Parupalli et al. |

OTHER PUBLICATIONS

Prommee, et al., "CMOS WTA maximum and minimum circuits with their applications to analog switch and rectifiers", Microelectronics Journal 42, 2011, Netherlands, pp. 52-62 (pp. 1-11 in pdf).

DIFFERENTIAL DRIVER HAVING INPUT SIGNAL-CONTROLLED COMMON-MODE REFERENCE

BACKGROUND

1. Field of Disclosure

The field of representative embodiments of this disclosure relates to differential drive circuits such as motor drivers and other power output electronics, and in particular to a differential driver in which the common-mode voltage of the output is controlled based on detection of an instant maximum value of a differential input signal.

2. Background

Differential linear amplifiers are in use as motor controllers, audio amplifiers, and other power output stages such as those for driving haptic feedback devices. While, due to the differential nature of the outputs, the output noise may be maintained at a low level, common-mode variations of the outputs due to power supply ripple and other noise, is typically present on both outputs. The noise on the amplifier driver outputs may couple into other circuits, in particular where the driver outputs are connected to large networks, or in designs in which the output circuit paths are required to extend along or across other circuit paths carrying signals that are sensitive to noise.

Since the above-described linear drivers typically have a common-mode voltage that is determined from a bipolar output power supply, with the common return providing the common-mode reference, the power supply ripple and noise translates directly to a common-mode variation present on both of the linear driver outputs. The power supply ripple and noise that is present also reduces the potential dynamic range of the linear driver outputs, since an output swing margin must be maintained that includes the maximum value of ripple and noise for each output. A voltage reference is sometimes used to provide a common-mode reference voltage for a differential linear driver, which can reduce or eliminate noise and ripple of the common-mode voltage. However, since the common-mode reference voltage is typically independent of the output power supply voltages, the dynamic range of the linear driver outputs will be limited by variation of the output power supply voltages, which are typically asymmetric with respect to a fixed common-mode reference that is not derived from or provided by the power supply.

Therefore, it would be advantageous to provide a differential linear driver that does not reflect the power supply variation on the outputs of the driver and that does not suffer a reduction in dynamic range due to asymmetric power supply voltage variation.

SUMMARY

Improved operation is accomplished in a differential amplifier circuit and integrated circuits and systems including the differential amplifier circuit, along with their methods of operation.

The differential amplifier circuit includes a driver circuit with a first output for driving a first output of the differential amplifier and with a second output for driving a second output of the differential amplifier. The driver circuit has inputs for receiving a differential (complementary) pair of input signals and at least one common-mode reference input for receiving a common-mode reference signal. The differential amplifier also includes a signal maxima detector having inputs for receiving the differential input signals that detects a maximum value between the individual signals, including any input common-mode voltage. The differential amplifier also includes a common-mode reference circuit that provides the common-mode reference signal and has an input coupled to an output of the signal maxima detector, so that a common-mode voltage of the outputs of the differential amplifier are independent of one or more power supply voltages provided to the driver circuit.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses circuits and integrated circuits that include improved differential amplifiers/linear drivers and their method of operation. Rather than referencing a common-mode voltage of the differential amplifier output to a midpoint of a power supply or providing a precision common-mode voltage reference to the amplifier, the present disclosure discloses differential amplifiers that receive a common-mode reference based on the input signal, in particular, the common-mode voltage of the output of the differential amplifier may be set to an instant maximum as between the two signals of a differential signal input provided to the differential amplifier. A signal maxima detector that receives the differential input signals and detects a maximum value between the individual signals, including any input common-mode voltage. A common-mode reference circuit provides a common-mode reference signal and has an input coupled to an output of the signal maxima detector, so that a common-mode voltage of the outputs of the differential amplifier are independent of one or more power supply voltages provided to the driver circuit.

Figure 1:
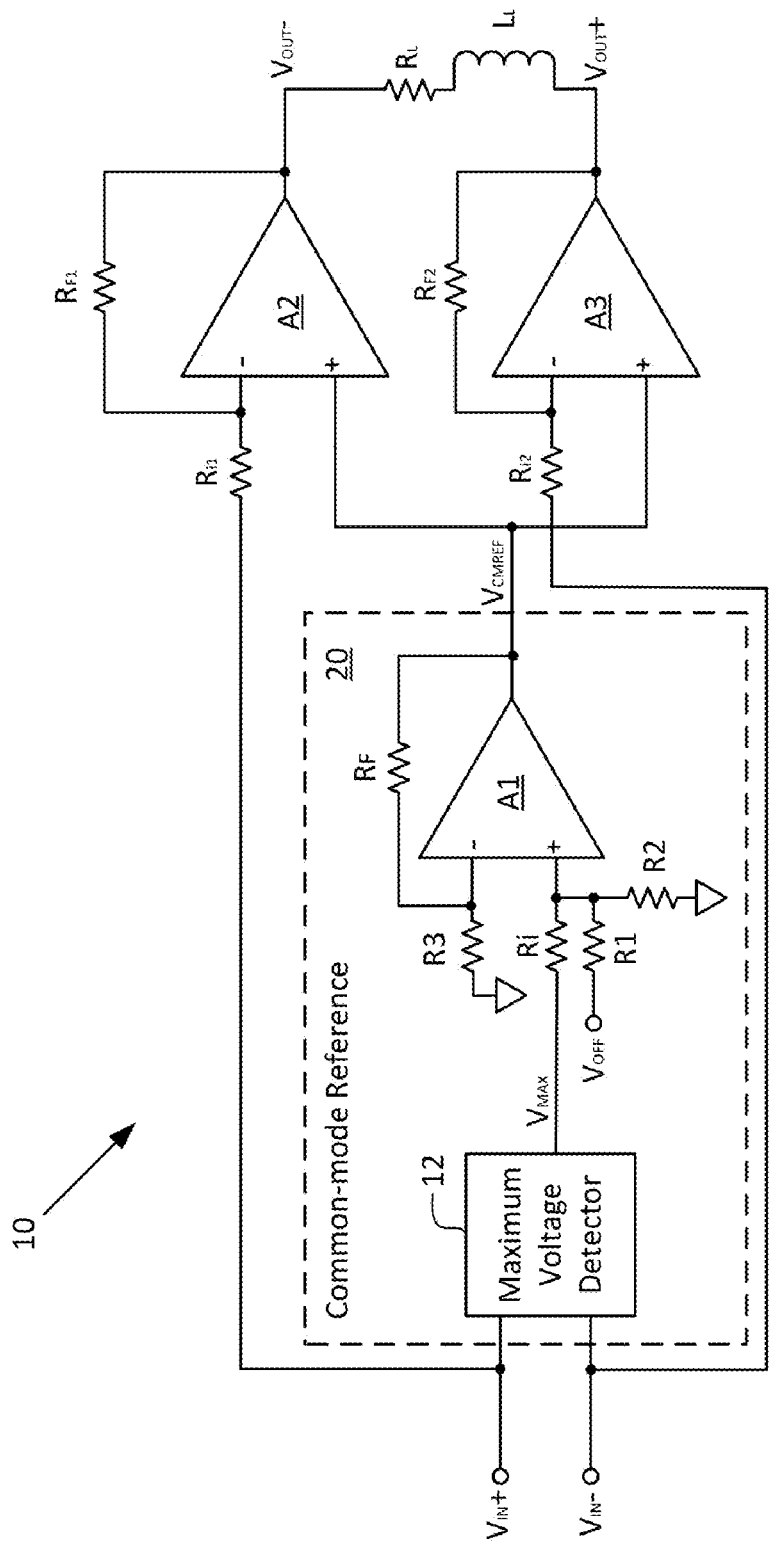
FIG. 1 is a block diagram illustrating an example differential amplifier circuit 10, in accordance with an embodiment of the disclosure.

Referring now to FIG. 1, a block diagram illustrating an example differential amplifier circuit 10 is shown, in accordance with an embodiment of the disclosure. Example differential amplifier circuit receives a differential pair of input signals $V_{IN+}$, $V_{IN-}$ and provides a differential pair of output signals $V_{OUT+}$, $V_{OUT-}$ into a load represented by a load resistance $R_L$ and a load inductance $L_L$. A pair of operational amplifiers A2, A3 provide output signals $V_{OUT-}$, $V_{OUT+}$, respectively. The gain of amplifier A2 is controlled by resistors $R_{F1}$ and $R_{i1}$ and the gain of amplifier A3 is controlled by resistors $R_{F2}$ and $R_{i2}$, which are coupled to the inverted input of amplifiers A2 and A3. The non-inverting inputs of amplifiers A2 and A3 are set to a signal-dependent common-mode voltage $V_{CMREF}$, which sets the common mode voltage of output signals $V_{OUT-}$, $V_{OUT+}$ to an input-signal dependent value. A maximum voltage detector 12 provides an output $V_{CMREF}$ that is the maximum instant positive value as between input signals $V_{IN+}$ and $V_{IN-}$. Maximum instant value means the varying voltage that is the greater of input signals $V_{IN+}$ and $V_{IN-}$, and not a peak or maxima of the waveforms. Since the common mode voltage supplied to both of operational amplifiers A2, A3 is common-mode reference voltage $V_{CMREF}$, the output signal voltages $V_{OUT-}$, $V_{OUT+}$ are given by:

$$V_{OUT+} = (k+1)V_{CMREF} - kV_{IN-} \text{ and}$$

$$V_{OUT-} = (k+1)V_{CMREF} - kV_{IN+}.$$

where k is a voltage gain of amplifiers A2, A3 as determined by their feedback networks, i.e., the resistance of resistor $R_{F1}$ divided by the resistance of resistor $R_{i1}$. Thus, the differential output voltage $V_{OUT+} - V_{OUT-}$ reduces to:

$$-kV_{IN-} + kV_{IN+} = k(V_{IN+} - V_{IN-}).$$

Defining the differential input voltage $V_{DIFFi}$ as $V_{DIFF} = V_{IN+} - V_{IN-}$, the resulting differential output voltage $V_{OUT+} - V_{OUT-}$ is $kV_{DIFFi}$, which is the desired gain applied to the differential input signal. The common-mode output voltage is defined as $V_{CMO} = (V_{OUT+} + V_{OUT-})/2$, which is:

$$V_{CMO} = \frac{2(k+1)V_{CMREF} - k(V_{IN+} - V_{IN-})}{2} = (k+1)V_{CMREF} - \frac{k(V_{IN+} - V_{IN-})}{2}.$$

Since the input common-mode input voltage $V_{CMi}$ is $(V_{IN+} + V_{IN-})/2$, the resulting common-mode output voltage can be expressed as:

$$V_{CMO} = (k+1)V_{CMREF} - kV_{CMi}$$

Common-mode reference voltage $V_{CMREF}$ at the output of the amplifier stage implemented by operational amplifier A1 is given by:

$$V_{CMREF} = (1+k_1)(V_{MAX} + V_{OFF}),$$

provided that gain $k_1$ is equal to the ratio of the resistance of resistor $R_F$ to the resistance of resistor $R_i$ and that the resistances of resistor $R_i$, R1 and R3 are equal, with the resistances of resistor $R_F$ and resistor R2 also equal. Since $V_{MAX} = V_{IN+}$ when $V_{DIFFi} > 0$, and $V_{MAX} = V_{IN-}$ when $V_{DIFFi} < 0$, $V_{MAX}$ can be re-written as:

$$V_{MAX} = V_{CMI} + \left|\frac{V_{DIFFi}}{2}\right|$$

and:

$$V_{CMREF} = (1+k_1)\left(V_{OFF} + V_{CMI} + \left|\frac{V_{DIFFi}}{2}\right|\right).$$

If the value of gain $k_1$ is set to $k/(k+1)$, then:

$$V_{CMO} = (k+1)\left[V_{OFF} + \frac{k}{(k+1)}V_{CMI} + \frac{k}{(k+1)}\left|\frac{V_{DIFFi}}{2}\right|\right] - kV_{CMI},$$

which reduces to:

$$V_{CMO} = (k+1)V_{OFF} + k\left|\frac{V_{DIFFi}}{2}\right|.$$

Thus, the output common-mode voltage $V_{CMO}$ is independent of the input common-mode voltage and is referenced at one-half of the differential input voltage scaled by gain k plus an offset that is determined by voltage $V_{OFF}$.

In effect, the setting of the output common-mode reference by the techniques described above, results in non-overlapping conduction of amplifiers A2, A3 into the load, with the proportion of the period of conduction of individual amplifiers A2, A3 being split at an input-signal-dependent time during a given waveform cycle such that the common-mode voltage of the output is maintained at $V_{CMO}$ and the outputs yield the desired differential output voltage. The use of maximum signal detector 12 within common-mode reference circuit 20 to set the output common-mode voltage leverages the symmetry of the input differential voltage to synthesize an output common-mode reference voltage and remove input common-mode voltage shift, by effectively varying the above-described split point to remove the input common-mode voltage provided on input signals $V_{IN+}$ and $V_{IN-}$. However, an offset may be deliberately applied by common-mode reference circuit 20 by applying an offset voltage $V_{OFF}$ to the amplifier circuit formed by operational amplifier A1, resistors R1-R3, $R_i$ and resistor $R_F$ to shift common-mode reference voltage $V_{CMREF}$, for example, when accommodating asymmetric power supply voltage, in order to maximize the available signal swing at the outputs of amplifiers A2 and A3.

Figure 2A:
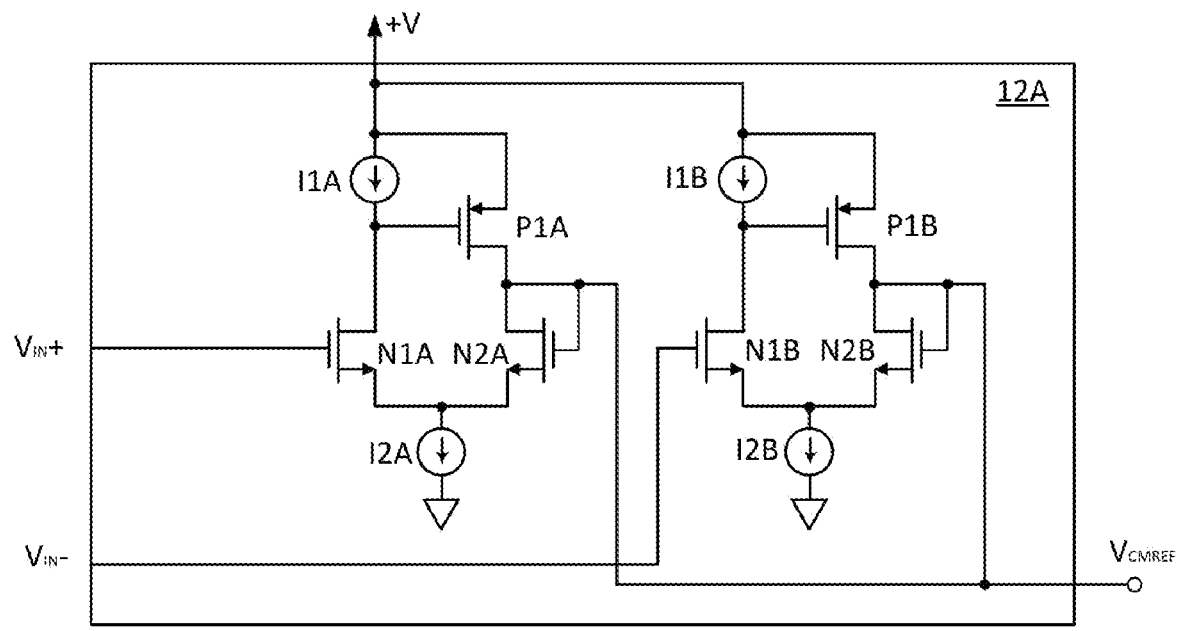
FIG. 2A is a schematic diagram illustrating an example maximum voltage detector 12A that may be used to implement maximum voltage detector 12 in example differential amplifier circuit 10 of FIG. 1, in accordance with an embodiment of the disclosure.

Referring now to FIG. 2A, a schematic diagram illustrating an example maximum voltage detector 12A that may be used to implement maximum voltage detector 12 in example differential amplifier circuit 10 of FIG. 1 is shown, in accordance with an embodiment of the disclosure. Example maximum voltage detector 12 includes a pair of voltage-follower stages, implemented as differential flipped voltage followers that reflect the voltages presented at gates of transistors N1A, N1B, which are coupled to input signals $V_{IN+}$ and $V_{IN-}$, respectively. Reference current sources I1A, I1B are mirrored by transistors P1A, P1B, respectively, so that the current through both transistors N1A, N2A and transistors of each branch N1B, N2B, respectively, are equal, which causes the drain terminals of transistors N2A, N2B to closely track input signals $V_{IN+}$ and $V_{IN-}$, respectively, since the gates of transistors N2A, N2B are coupled to their respective gates. Current sources I2A, I2B sum the source currents of transistor pairs N1A, N2A and N1B, N2B, respectively. The outputs of the voltage-follower stages, i.e., the drain terminals of transistors N2A and N2B are connected together. In the depicted circuit, whichever voltage at the inputs of transistors N1A, N1B is greater will "win" and be reflected on output $V_{CMREF}$, as the voltage-follower stage receiving the non-winning voltage will enter cut-off quickly, due to the increased voltage at the drain of the other one of transistors N1A, N1B, which reduces the current through the corresponding mirror transistor P1A, P1B, effectively turning off the other voltage-follower.

Figure 2B:
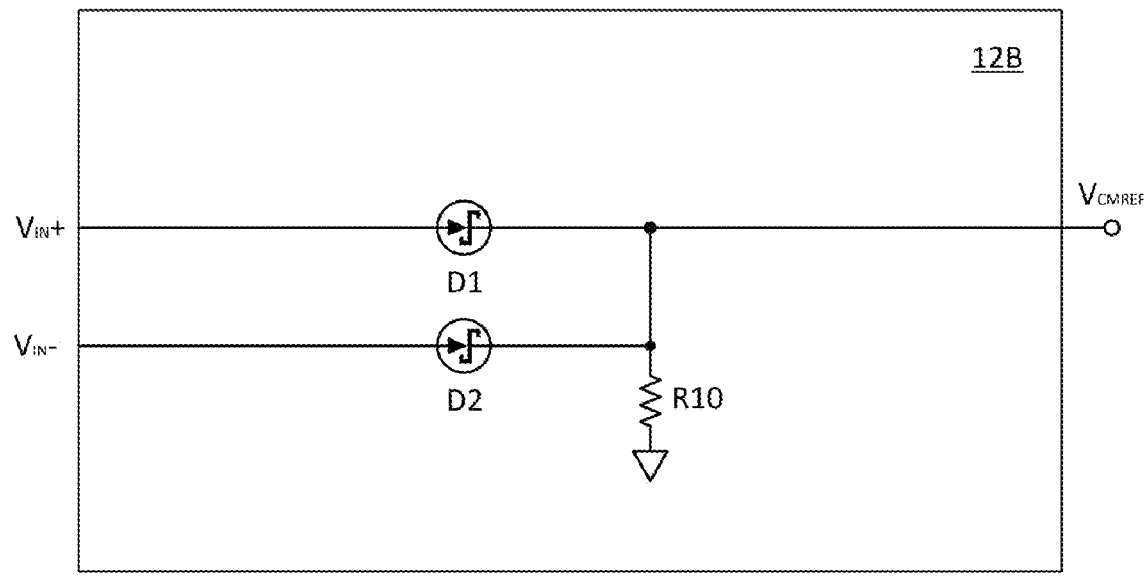
FIG. 2B is a schematic diagram illustrating another example maximum voltage detector 12B that may be used to implement maximum voltage detector 212 in example differential amplifier circuit 10 of FIG. 1, in accordance with another embodiment of the disclosure.

Referring now to FIG. 2B, a schematic diagram illustrating another example maximum voltage detector 12B that may be used to implement maximum voltage detector 212 in example differential amplifier circuit 10 of FIG. 1 is shown, in accordance with another embodiment of the disclosure. A pair of low-voltage-drop diodes D1, D2 form a half-bridge that passes the maximum voltage as between input signals $V_{IN+}$ and $V_{IN}$ to produce common-mode voltage reference output $V_{CMREF}$ across a resistor R10. If such an arrangement is used, an additional offset may be added to offset voltage $V_{OFF}$ to compensate for the voltage drop of diodes D1, D2, e.g., 0.2V~0.3V for Schottky diodes D1, D2.

Figure 3:
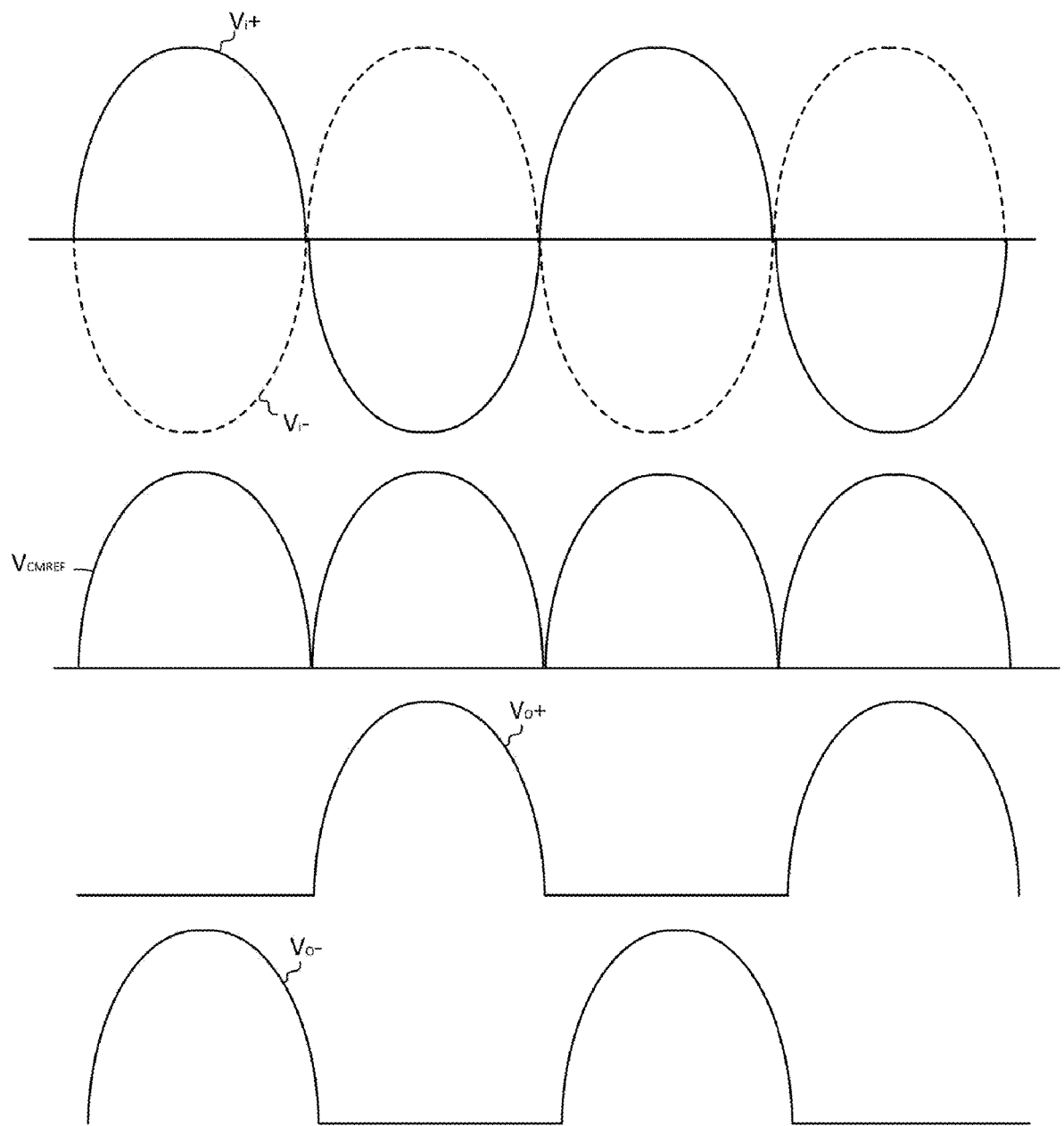
FIG. 3 is an example signal waveform diagram illustrating operation of differential amplifier circuit 10 of FIG. 1, in accordance with an embodiment of the disclosure.

Referring now to FIG. 3, an example signal waveform diagram illustrating operation of differential amplifier circuit 10 of FIG. 1 is shown, in accordance with an embodiment of the disclosure. Differential input signals $V_{i+}$, $V_{i-}$ are shown at the top of FIG. 3. Common-mode reference signal $V_{CMREF}$, in the center of the diagram, tracks the maximum as between differential input signals $V_{i+}$, $V_{i-}$. In the bottom of the diagram, the output terminal voltages $V_{O+}$, $V_{O-}$ are shown. As illustrated and described above, only one of output terminal voltages $V_{O+}$, $V_{O-}$ varies in a given portion of the cycle, while the other one of output terminal voltages $V_{O+}$, $V_{O-}$ serves as a current sink. As mentioned above, the scheme may be inverted, so that the other one of output terminal voltages $V_{O+}$, $V_{O-}$ serves as a current source, rather than sink, in which case both of the bottom waveforms of output terminal voltages $V_{O+}$, $V_{O-}$ would be inverted, as well as the common-mode reference signal $V_{CMREF}$ waveform, which would be derived from a minimum voltage as between input signals $V_{i+}$, $V_{i-}$.

Figure 4A:
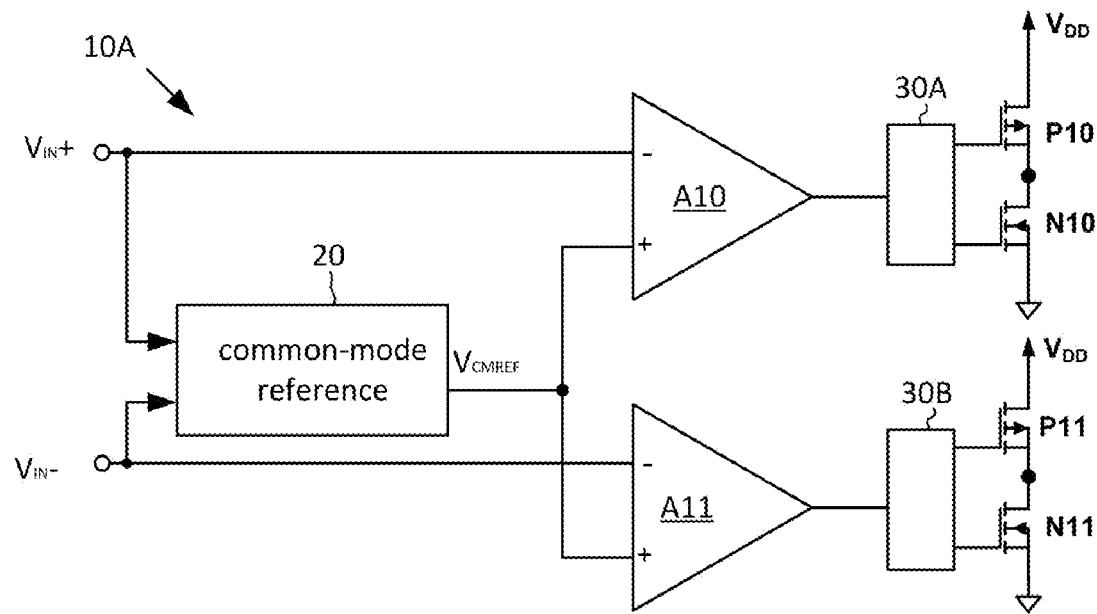
FIG. 4A and FIG. 4B are simplified schematic diagrams illustrating different example differential amplifier topologies 10A and 10B, respectively, in accordance with embodiments of the disclosure.
Figure 4B:
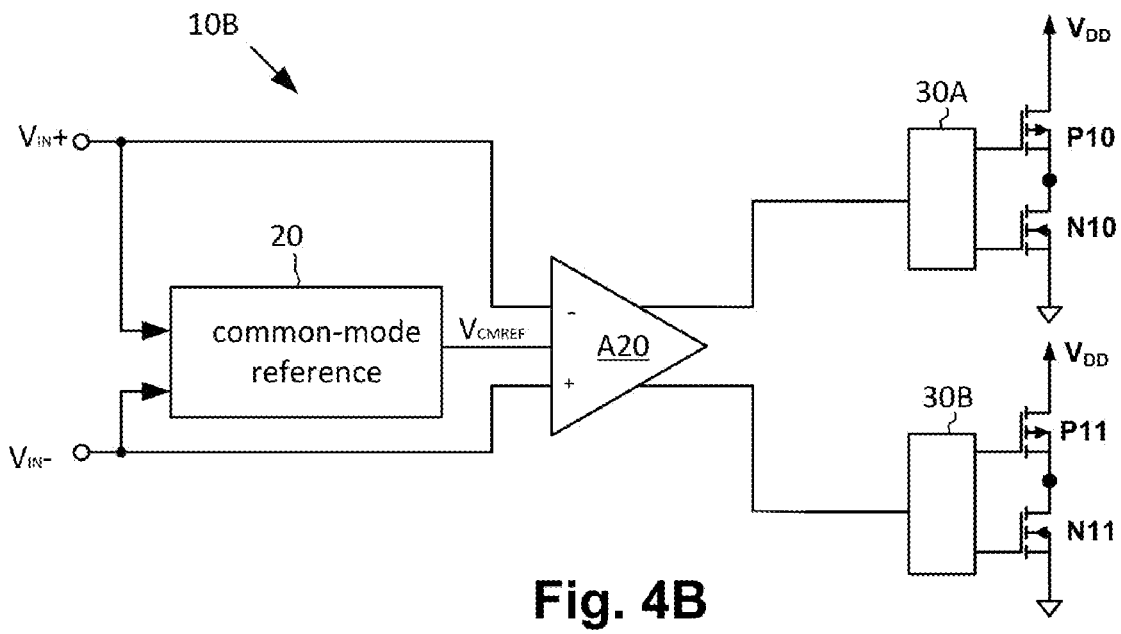

Referring now to FIG. 4A and FIG. 4B simplified schematic diagrams illustrating different example differential amplifier topologies 10A and 10B, respectively, are shown in accordance with embodiments of the disclosure. Example differential amplifier topology 10A in FIG. 4A illustrates a circuit similar to that shown in FIG. 1, but further illustrates an output driver circuit formed by transistor pairs formed by transistors P10, N10 and transistors P11, N11, which may implement, for example, an audio amplifier, or other linear driver circuit. Input to the output driver circuit is provided from operational amplifiers A10 and A11, which are also configured in a manner similar to that illustrated in FIG. 1. Common mode reference circuit 20 provides a common mode reference voltage $V_{CMREF}$ to the non-inverting inputs of operational amplifiers A10 and A11, which provide inputs to bias circuits 30A and 30B for driving transistors P10, N10 and transistors P11, N11. Example differential amplifier topology 10B of FIG. 4B is similar to example amplifier topology 10A of FIG. 4A, except that amplifier A20 is designed as a fully-differential operational amplifier having a common-mode reference input, which is provided with common-mode reference voltage $V_{CMREF}$ from common-mode reference circuit 12, which includes a maximum signal detector.

Figure 5A:
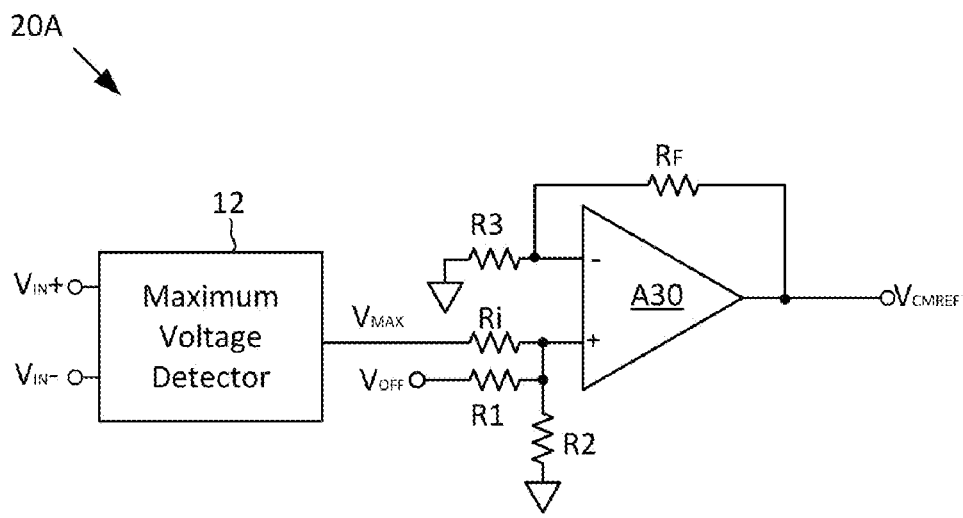
FIG. 5A and FIG. 5B are simplified schematic diagrams illustrating different example common-mode reference circuits 20A and 20B, respectively, that may be used to implement common-mode reference circuit 20 of FIG. 1, in accordance with embodiments of the disclosure.
Figure 5B:
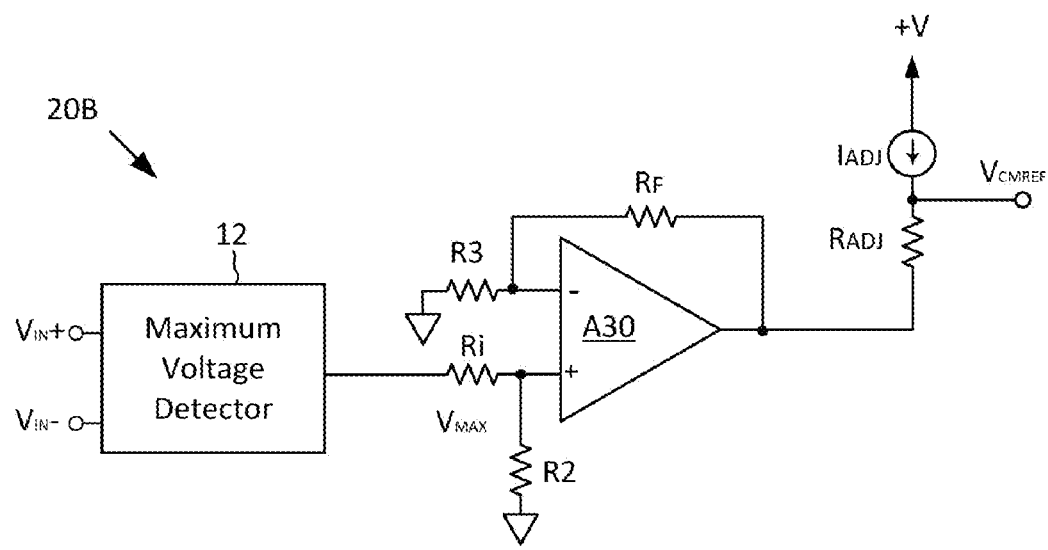

Referring now to FIG. 5A and FIG. 5B, simplified schematic diagrams of different common-mode reference circuits 20A and 20B, respectively, that may be used to implement common-mode reference circuit 20 of FIG. 1, in accordance with embodiments of the disclosure. Example common-mode reference circuit 20A in FIG. 5A illustrates a circuit similar to that shown in FIG. 1, in which an offset voltage $V_{OFF}$ may be injected to optimize the dynamic range of differential amplifier 10 of FIG. 1. Example common-mode reference circuit 20B in FIG. 5B illustrates another common-mode reference circuit having offset adjustment provided by a current source $I_{ADJ}$ and a resistor $R_{ADJ}$, either or both of which may be made adjustable/selectable to alter a voltage drop across resistor $R_{ADJ}$ that provides a voltage adjustment of common-mode reference voltage $V_{CMREF}$, which is equivalent to offset voltage $V_{OFF}$ described above with reference to FIG. 1, where $V_{OFF}=I_{ADJ}R_{ADJ}/(k+1)$ due to the application of the offset after the gain (k+1) of operational amplifier A30 has been applied to voltage $V_{MAX}$.

Figure 6:
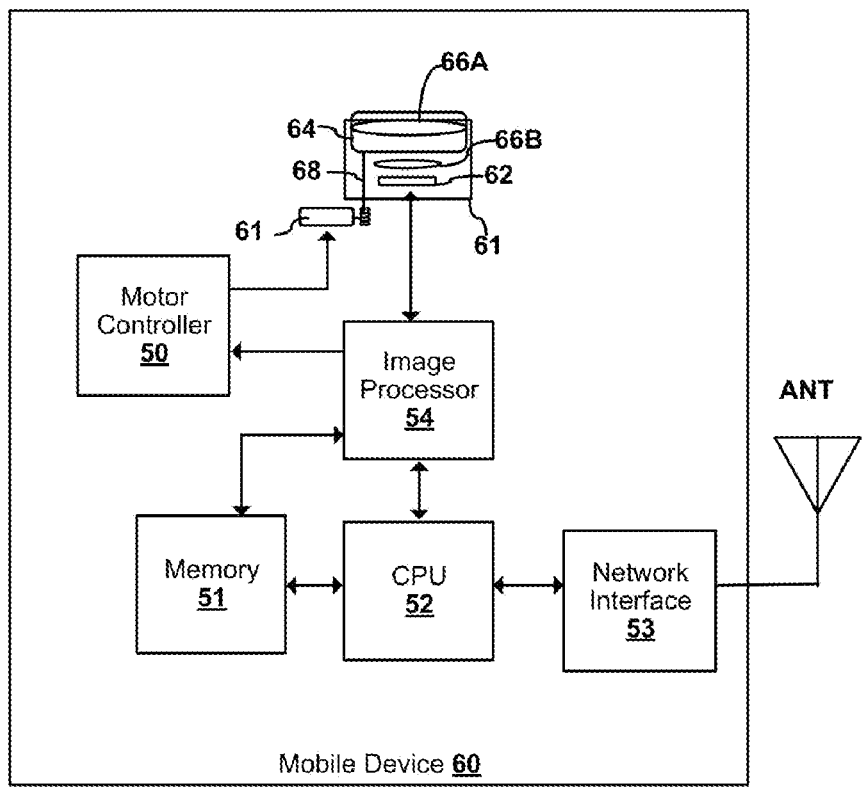
FIG. 6 is a block diagram illustrating an example mobile device 60, in accordance with an embodiment of the disclosure.

Referring now to FIG. 6, a simplified schematic diagram of an example mobile device 60 implementing an example electronic control system is shown, in accordance with an embodiment of the disclosure. Example mobile device 60 may be a wireless mobile telephone, tablet, notebook computer, or a similar device. Alternatively, mobile device may be a digital camera or other system that incorporates a position-controlled image sensor. Operation of mobile device 60 is controlled by a central processing unit (CPU) 52, which may be a microcontroller, microprocessor or other processor core, such as a processor core in a dedicated system-on-chip (SOC) implementation. CPU 52 is coupled to a memory 51 that stores program instructions forming a computer-program product, program data and other data such as media, including digital photographs. Memory 51 may include both non-volatile and dynamic storage elements. A network interface 53 provides for connection of mobile device 60 to a wireless network via an antenna ANT, but is not required for implementation of embodiments according to the disclosure, for example an electronic motor control system in a camera providing only a wired interface. A separate image processor 54 is also coupled to memory 53, and memory may comprise separate storage for program instructions forming another computer-program product, and data that may not be accessed directly by CPU 52. Image processor 54 provides an interface for receiving data from an image sensor 62 of a camera 61 within mobile device 10 and also provides an interface to a motor controller 50 that controls a motor 61 that positions a movable lens 66A, or multiple lenses, of camera 61, responsive to commands from image processor 54 that cause movement of a mount 64 via a mechanical linkage 68 coupled to motor 61. The commands are generally motor current commands to control the speed of the motor as computed by CPU 52 or image processor 54, which may provide zoom, auto-focus and image stabilization functions. Another fixed lens 66B receives an image from movable lens 66A to produce an image of the subject of a photograph or other image processing subject on image sensor 62. Motor controller 50 may include a differential amplifier having features as described above with reference to FIG. 1, that generate a common-mode reference signal from a differential input signal, in accordance with an embodiment of the disclosure.

Figure 7:
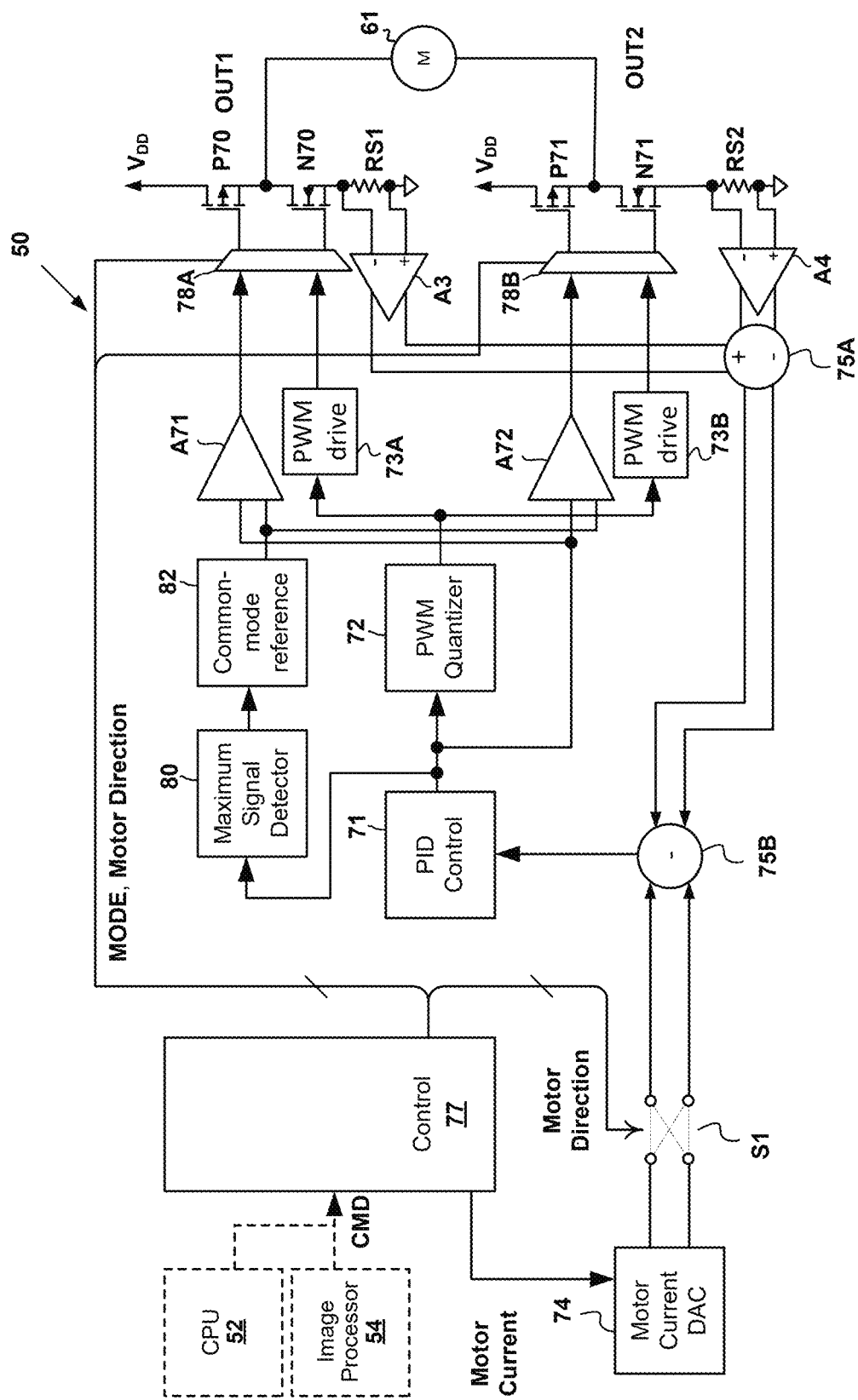
FIG. 7 is a simplified schematic diagram illustrating an example motor controller 50 of FIG. 6, in accordance with an embodiment of the disclosure.

Referring now to FIG. 7, a simplified schematic diagram of an example motor controller 50 that may be used to implement motor controller 50 of FIG. 1 is shown, in accordance with an embodiment of the disclosure. Each half of an H-bridge formed by transistors P70, P71, N70 and N71 includes a current sense resistor RS1, RS2 that provide sense voltage inputs to current monitoring fully-differential amplifiers A3 and A4, respectively. In a linear operating mode, the voltages across both sense resistors RS1, RS2 are measured by fully-differential amplifiers A3 and A4 and are subtracted by a combiner 75A, which causes cancelation of a measured class-AB bias current conducted by both sides of the H-bridge, while the motor current remains in the measurement, since only one of transistors N70 or N71 is conducting the motor current. In some embodiments, as described in U.S. patent application Ser. No. 17/230,789 filed on Apr. 14, 2021, the disclosure of which is incorporated herein by reference, in PWM mode, the motor current may be sensed on the "sink" side, i.e., through the sense resistor RS1 or RS2 that is connected to one of transistors N1 or N2 that is turned on to sink current provided through motor 61 from the other side of the H-bridge. In such embodiments, the current is provided from a direction that is selected depending on the state of a control signal Motor Direction provided from a control block 677 and that selects one side of the H-bridge to operate statically, while the other side of the H-bridge is pulse-width modulated. In other embodiments, both sides of the H-bridge may be modulated.

Input to example motor controller 50, is provided from CPU 52 or image processor 54 of FIG. 6, or both, to control block 77. A motor current command, which is indicated by a command input CMD, includes a digital input value Motor Current provided to a motor current digital-to-analog converter (DAC) 74 that is coupled through cross-point switch Si, which interchanges the output signals of motor current DAC 74 to provide negative values corresponding to a reverse motor direction when control signal Motor Direction is asserted. Control signal Motor Direction, also provided by command input CMD, is sent to select linear or PWM operating mode to set the motor direction. Control signal Mode sets the PWM operating mode when asserted and sets the linear operating mode when de-asserted. Control signal Mode may be provided by command input CMD or may be originated in control block 77, e.g., in response to continuous detection of position error, so that linear mode may be entered when the position error is small.

A combiner 75B generates feedback signals from a differential output of combiner 75A, which is subtracted from the direction-corrected motor current command value provided from switch Si, also as a differential voltage, which sets a commanded motor current level by generating the output of combiner 75B as a motor current error level, i.e., the difference between the current being delivered to motor 61 and the current commanded by motor current DAC 74. The output of combiner 75B is provided as an input to a proportional integral-derivative (PID) control block 71. PID control block 71 corrects for the phase difference between the motor current through the inductive load of motor 61 and the voltage across motor 61, and generates an output that provides an input to a PWM quantizer 72, which generates PWM output signals that provide inputs to a pair of PWM drive blocks 73A and 73B. The outputs of PWM drive blocks 73A, 73B are provided as inputs to respective selector blocks 78A, 78B. Selector blocks 78A, 78B select between providing an output of one of PWM drive blocks 73A, 73B to a side of the H-bridge that is being modulated when a control signal MODE is asserted, while enabling the N-channel transistor N70 or N71 on the other side of H-bridge to conduct the current returning from motor 61 to the power supply return. The P-channel transistor P70 or P71 on the non-modulated side of the H-bridge is turned off by the corresponding one of selector blocks 78A, 78B or by an external pull-up configuration (not shown).

In the linear operating mode, as selected by control block 77 de-asserting control signal MODE, the outputs of both of a pair of linear driver amplifiers A71, A72 are coupled to their corresponding side of the H-bridge. Linear driver amplifiers A71, A72 also receive the output of PID control block 71, so that a common feedback loop may be shared between linear and PWM mode drive. The output of PID control block 71 is a differential output that is provided to a maximum signal detector 80 and a common-mode reference circuit 82 as described above in any of the embodiments, which sets the output common-mode voltages of the output driver circuits providing outputs OUT1 and OUT2 to a level determined by the maximum voltage as between the signals of the differential output of PID control 71, as described above. Linear driver amplifiers A71, A72 have a gain that compensates for the difference between the single-ended PWM signal generated by only one half of the H-bridge vs. the differential signaling during operation of the H-bridge in linear mode, e.g., an attenuation of ½ for a unity-gain PWM mode or a gain of ½ of the gain value in PWM mode, e.g., a gain of 5 vs. a PWM gain of 10. Selector blocks 78A, 78B, also include the bias resistors or active bias circuits that bias transistors P70, P71, N70 and N71 to provide Class AB bias when linear mode is selected, i.e., all of transistors P70, P71, N70 and N71 conduct a bias current in addition to signal current. For single-ended operation, a class-A bias may be employed instead, for the single push-pull output stage implementing the single-ended output.

In summary, this disclosure shows and describes differential amplifier circuits and systems that incorporate the differential amplifier, and their methods of operation. The differential amplifier circuit includes a driver circuit having a first output for driving a first output of the differential amplifier and a second output for driving a second output of the differential amplifier. The driver circuit may have a first input for receiving a first drive signal, a second input for receiving a second drive signal, and at least one common-mode reference input for receiving a common-mode reference signal, where the second output is a complementary output to the first output of the driver circuit. The differential amplifier may also include a signal maxima detector having a differential input for receiving the first drive signal and the second drive signal, where the maxima detector detects a maximum value of the first drive signal and the second drive signal including any common-mode voltage of the first drive signal and the second drive signal. The differential amplifier also may include a common-mode reference circuit having an output for providing the common-mode reference signal and an input coupled to an output of the signal maxima detector, so that a common-mode voltage of the first output of the differential amplifier and the second output of the differential amplifier are independent of one or more power supply voltages provided to the driver circuit.

In some example embodiments, wherein the driver circuit may include a first amplifier circuit having a first output for driving a first output of the differential amplifier, a first input for receiving a first drive signal and a second input for receiving a common-mode reference signal, and a second amplifier circuit having a second output for driving a second output of the differential amplifier, a third input for receiving a second drive signal and a fourth input for receiving the common-mode reference signal. In other example embodiments, the driver circuit may be a single amplifier circuit having a differential input for receiving the first drive signal and the second drive signal as a differential pair and a common mode input for receiving the common-mode reference signal. In some example embodiments, the common-mode reference circuit may add an offset to the output of the signal maxima detector to provide additional signal swing range at the outputs of the differential amplifier.

In some example embodiments, the signal maxima detector may be provided by an analog winner-take-all (WTA) circuit, and in some example embodiments, the WTA circuit may include a first voltage follower circuit having an input coupled to the first drive signal, and a second voltage follower circuit having an input coupled to the second drive signal, and an output of the first voltage follower circuit and an output of the second voltage follower circuit may be coupled together to provide the output of the signal maxima detector, so that a voltage of the output of the signal maxima detector follows a greater one of a voltage of the first drive signal and the second drive signal. In other example embodiments, the signal maxima detector may include a low-offset rectifier circuit having an offset determined by the common-mode reference signal, a first input for receiving the first drive signal, and a second input for receiving the second drive signal, wherein the low-offset rectifier circuit generates an output according to a maximum value as between the first drive signal and the second drive signal.

In some example embodiments, the differential amplifier is included in a system for providing a power output to a load. The system may include an output stage for supplying the current to the load. The output stage may have a first push-pull driver coupled to a first output for coupling to a first terminal of the load and a second push-pull driver coupled to a second output for coupling to a second terminal of the load. The system may further include: a mode selection control circuit for selecting between a pulse-width modulated mode and a linear mode of the system, a pulse-width modulator output driver for providing pulse-width modulated drive signals to an input of the output stage when the mode selection control circuit selects the pulse-width modulated mode, and a linear amplifier stage for providing a linear analog signal to the input of the output stage when the mode selection control circuit selects the linear mode. Both the first push-pull driver and the second push-pull driver may be operated to supply the current to the load when the mode selection control circuit selects the linear mode. The linear amplifier stage may be provided by the included differential amplifier circuit as described above. In some example embodiments, the load may be a motor, the output stage may supply current to the motor, and wherein the system may further include a feedback control loop for sensing the current supplied to the motor and providing a first output to the pulse-width modulator and a second output to the linear amplifier stage. In some example embodiments, wherein the first drive signal and the second drive signal may be complementary differential outputs of a proportional integral-derivative (PID) control block that compensates for a motor current phase difference caused by the inductive load of the motor. In some example embodiments, when the mode selection circuit selects the linear mode, the first push-pull driver and the second push-pull driver may be operated as class-AB linear drivers.

In some example embodiments, the differential amplifier circuit may implement a method of generating a differential output drive signal, that may include receiving a differential drive signal having an input common-mode voltage and composed of a first drive signal and a second complementary drive signal, generating a common-mode reference by detecting an instant maximum voltage of the first drive signal and the second complementary drive signal and generating a time-varying common-mode reference signal from the detected instant maximum voltage, and driving a first output of a driver circuit of a differential amplifier with the first drive signal and a second output of the driver circuit with the second drive signal. The first output and second output may have a common-mode voltage controlled by the common-mode reference signal and differential outputs controlled by the first drive signal and the second drive signal, so that a common-mode voltage of the first output of the driver circuit and the second output of the driver circuit are independent of one or more power supply voltages provided to the driver circuit.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to an audio amplifier or a control system for supplying signals to a haptic device.

What is claimed is:

1. A differential amplifier circuit, comprising:
   a driver circuit having a first output for driving a first output of the differential amplifier and a second output for driving a second output of the differential amplifier, wherein the driver circuit has a first input for receiving a first drive signal, a second input for receiving a second drive signal and at least one common-mode reference input for receiving a common-mode reference signal, wherein the second output is a complementary output to the first output of the driver circuit;
   a signal maxima detector having a differential input for receiving the first drive signal and the second drive signal, wherein the maxima detector detects a maximum value of the first drive signal and the second drive signal including any common-mode voltage of the first drive signal and the second drive signal; and
   a common-mode reference circuit having an output for providing the common-mode reference signal and an input coupled to an output of the signal maxima detector, whereby a common-mode voltage of the first output of the differential amplifier and the second output of the differential amplifier are independent of one or more power supply voltages provided to the driver circuit.

2. The differential amplifier circuit of claim 1, wherein the driver circuit comprises:
   a first amplifier circuit having a first amplifier output for driving the first output of the differential amplifier, a first input for receiving a first drive signal and a second input for receiving a common-mode reference signal; and
   a second amplifier circuit having a second amplifier output for driving the second output of the differential amplifier, a third input for receiving a second drive signal and a fourth input for receiving the common-mode reference signal.

3. The differential amplifier circuit of claim 1, wherein the driver circuit comprises a single amplifier circuit having a differential amplifier input for receiving the first drive signal and the second drive signal as a differential pair and a common mode input for receiving the common-mode reference signal.

4. The differential amplifier circuit of claim 1, wherein the common-mode reference circuit adds an offset to the output of the signal maxima detector to provide additional signal swing range at the outputs of the differential amplifier.

5. The differential amplifier of claim 1, wherein the signal maxima detector comprises an analog winner-take-all (WTA) circuit.

6. The differential amplifier of claim 5, wherein the WTA circuit comprises:
a first voltage follower circuit having an input coupled to the first drive signal; and
a second voltage follower circuit having an input coupled to the second drive signal, and wherein an output of the first voltage follower circuit and an output of the second voltage follower circuit are coupled together to provide the output of the signal maxima detector, whereby a voltage of the output of the signal maxima detector follows a greater one of a voltage of the first drive signal and the second drive signal.

7. The differential amplifier of claim 1, wherein the signal maxima detector comprises a low-offset rectifier circuit having an offset determined by the common-mode reference signal, a first input for receiving the first drive signal, and a second input for receiving the second drive signal, wherein the low-offset rectifier circuit generates an output according to a maximum value as between the first drive signal and the second drive signal.

8. A system for providing a power output to a load, comprising:
an output stage for supplying the current to the load, the output stage having a first push-pull driver coupled to a first output for coupling to a first terminal of the load and a second push-pull driver coupled to a second output for coupling to a second terminal of the load;
a mode selection control circuit for selecting between a pulse-width modulated mode and a linear mode of the system;
a pulse-width modulator output driver for providing pulse-width modulated drive signals to an input of the output stage when the mode selection control circuit selects the pulse-width modulated mode; and
a linear amplifier stage for providing a linear analog signal to the input of the output stage when the mode selection control circuit selects the linear mode, wherein both the first push-pull driver and the second push-pull driver are operated to supply the current to the load when the mode selection control circuit selects the linear mode, wherein the linear amplifier stage comprises a driver circuit having a first output for driving a first output of the differential amplifier, a second output for driving a second output of the differential amplifier, a first input for receiving a first drive signal, a second input for receiving a second drive signal, and at least one third input for receiving a common-mode reference signal, and wherein the second output is a complementary output to the first output of the driver circuit, wherein the linear amplifier stage further comprises a signal maxima detector having a differential input for receiving the first drive signal and the second drive signal, wherein the maxima detector detects a maximum value of the first drive signal and the second drive signal including any common-mode voltage of the first drive signal and the second drive signal, and wherein the linear amplifier stage comprises a common-mode reference circuit having an output for providing the common-mode reference signal and an input coupled to an output of the signal maxima detector, whereby a common-mode voltage of the first output of the driver circuit and the second output of the driver circuit are independent of one or more power supply voltages provided to the driver circuit.

9. The system of claim 8, wherein the load is a motor, wherein the output stage supplies current to the motor, and wherein the system further comprises a feedback control loop for sensing the current supplied to the motor and providing a first output to the pulse-width modulator and a second output to the linear amplifier stage.

10. The system of claim 8, wherein the first drive signal and the second drive signal are complementary differential outputs of a proportional integral-derivative (PID) control block that compensates for a motor current phase difference caused by the inductive load of the motor.

11. The system of claim 8, wherein when the mode selection circuit selects the linear mode, the first push-pull driver and the second push-pull driver are operated as class-AB linear drivers.

12. A method of generating a differential output drive signal, comprising:
receiving a differential drive signal having an input common-mode voltage and composed of a first drive signal and a second complementary drive signal;
generating a common-mode reference by detecting an instant maximum voltage of the first drive signal and the second complementary drive signal and generating a time-varying common-mode reference signal from the detected instant maximum voltage; and
driving a first output of a driver circuit of a differential amplifier with the first drive signal and a second output of the driver circuit with the second drive signal, wherein the first output and second output have a common-mode voltage controlled by the common-mode reference signal and differential outputs controlled by the first drive signal and the second drive signal, whereby a common-mode voltage of the first output of the driver circuit and the second output of the driver circuit are independent of one or more power supply voltages provided to the driver circuit.

13. The method of claim 12, wherein the driving is performed by a driver circuit comprising:
a first amplifier circuit having a first amplifier output for driving the first output of the differential amplifier, a first input for receiving a first drive signal and a second input for receiving a common-mode reference signal; and
a second amplifier circuit having a second amplifier output for driving the second output of the differential amplifier, a third input for receiving a second drive signal and a fourth input for receiving the common-mode reference signal.

14. The method of claim 12, wherein the driving is performed by a driver circuit comprising a single amplifier circuit having a differential input for receiving the first and second drive signal as a differential pair and a common mode input for receiving the common-mode reference signal.

15. The method of claim 12, further comprising adding an offset to the output of the signal maxima detector to provide additional signal swing range at the outputs of the differential amplifier.

16. The method of claim 12, wherein the detecting an instant maximum voltage is performed by an analog winner-take-all (WTA) circuit.

17. The method of claim 16, wherein the WTA circuit comprises:

a first voltage follower circuit having an input coupled to the first drive signal; and a second voltage follower circuit having an input coupled to the second drive signal, and wherein an output of the first voltage follower circuit and an output of the second voltage follower circuit are coupled together to provide the output of the signal maxima detector, whereby a voltage of the output of the signal maxima detector follows a greater one of a voltage of the first drive signal and the second drive signal.

18. The method of claim 12, wherein the signal maxima detector comprises a low-offset rectifier circuit having an offset determined by the common-mode reference signal, a first input for receiving the first drive signal, and a second input for receiving the second drive signal, wherein the low-offset rectifier circuit generates an output according to a maximum value as between the first drive signal and the second drive signal.

19. The method of claim 12, wherein the method is a method of operation of a linear signal path of a system having a selectable pulse-width modulated or linear drive for supplying power to a load, and wherein the method further comprises:

selecting between a pulse-width modulated mode and a linear mode of the system;

responsive to selection of the pulse-width modulated mode, providing pulse-width modulated drive signals to the driver circuit from a pulse-width modulator; and responsive to selection of the linear mode, providing the first drive signal and the second complementary drive signal to the driver circuit.

20. The method of claim 19, wherein the load is a motor, wherein the driver circuit supplies current to the motor, and wherein the system further comprises a feedback control loop for sensing the current supplied to the motor and providing a first output to the pulse-width modulator and a second output to a linear amplifier stage that provides the differential drive signal received by the receiving.

21. The method of claim 19, wherein the first drive signal and the second drive signal are complementary differential outputs of a proportional integral-derivative (PID) control block that compensates for a motor current phase difference caused by the inductive load of the motor.

22. The method of claim 19, wherein, in response to the selecting having selected the linear mode, the driver circuit is operated as class-AB linear driver.

* * * * *

UNITED STATES PATENT AND TRADEMARK OFFICE
CERTIFICATE OF CORRECTION

Page 1 of 1

PATENT NO. : 12,431,850 B2
APPLICATION NO. : 17/894294
DATED : September 30, 2025
INVENTOR(S) : Vamsikrishna Parupalli It is certified that error appears in the above-identified patent and that said Letters Patent is hereby corrected as shown below:

In the Specification

In Column 7, Line 35, delete "Si," and insert -- S1, --, therefor.

In Column 7, Line 50, delete "Si," and insert -- S1, --, therefor.

Signed and Sealed this
Ninth Day of December, 2025

John A. Squires
*Director of the United States Patent and Trademark Office*